United States Patent [19]
Montesano et al.

[11] Patent Number: 5,455,738
[45] Date of Patent: Oct. 3, 1995

[54] HIGH THERMAL CONDUCTIVITY, MATCHED CTE. LOW DENSITY MOUNTING PLATE FOR A SEMICONDUCTOR CIRCUIT

[75] Inventors: Mark J. Montesano, Fairfax, Va.; John T. Wigand, Laurel, Md.; Joseph C. Roesch, Fairfax, Va.

[73] Assignee: E-Systems, Inc., Dallas, Tex.

[21] Appl. No.: 97,903

[22] Filed: Jul. 28, 1993

[51] Int. Cl.⁶ ........................................... H05K 7/20
[52] U.S. Cl. .......................... 361/707; 75/243; 75/247; 75/249; 428/565; 428/901
[58] Field of Search ................. 75/200, 243, 47, 75/249; 361/704, 705, 707, 708, 712, 720; 419/11, 23, 48; 423/466; 428/539.5, 402, 446, 55, 551–554, 558–559, 561, 565, 901

[56] References Cited

U.S. PATENT DOCUMENTS

| | | | |
|---|---|---|---|
| 3,721,289 | 3/1973 | Seal . | |
| 3,828,848 | 8/1974 | Custers et al. | 165/185 |
| 3,912,580 | 10/1975 | Vereschagin et al. | 75/200 |
| 4,333,986 | 6/1982 | Tsuji et al. | 423/446 |
| 4,412,980 | 11/1983 | Tsuji et al. . | |
| 4,425,315 | 1/1984 | Tsuji et al. | 423/446 |
| 4,595,603 | 6/1986 | Davies et al. . | |
| 4,636,253 | 1/1987 | Nakai et al. | 75/243 |
| 4,948,388 | 8/1990 | Ringwood . | |
| 5,008,737 | 4/1991 | Burnham et al. . | |
| 5,045,972 | 9/1991 | Supan et al. . | |
| 5,120,495 | 6/1992 | Supan et al. . | |
| 5,130,771 | 7/1992 | Burnham et al. . | |
| 5,146,314 | 9/1992 | Pankove . | |

OTHER PUBLICATIONS

E. G. Loeffel et al "Heat Transfer Apparatus for Semiconductor Chip", IBM Technical Disclosure Bulletin vol. 21, No. 6, Nov. 1978.

Primary Examiner—Gregory D. Thompson
Attorney, Agent, or Firm—Rogers & Killeen

[57] ABSTRACT

A circuit card assembly thermal core includes a composite material that includes particles of diamond and a conductive metal such as aluminum, copper, nickel and beryllium and which may be made by pressure infiltration casting. The diamond particles are 110 to 160 microns in size and 10 to 80 percent by volume, and preferably 140 to 160 microns in size and 40 to 60 percent by volume. The composite material has both a high thermal conductivity and low density which may be matched with the coefficient of thermal expansion of other materials with which used.

8 Claims, 2 Drawing Sheets

HIGH THERMAL CONDUCTIVITY, MATCHED CTE. LOW DENSITY MOUNTING PLATE FOR A SEMICONDUCTOR CIRCUIT

BACKGROUND OF THE INVENTION

This invention relates to diamond/metal composites particularly useful as electrical component mounting plates and enclosures.

Hermetically sealed enclosures for electrical components are desirable to protect the electrical components from damaging environmental conditions such as moisture and airborne dust. Electrical components and electrical circuits mounted in hermetically sealed enclosures are often used in equipment which is subjected to wide temperature and pressure variations. For instance, when electrical components are used on an aircraft which rises from ground level into the upper atmosphere the temperature can drop more than a hundred degrees fahrenheit. In addition, the electrical components often generate substantial amounts of heat which can be damaging to the components and/or their predictable operation.

Diamond/metal composites are well known as is the fact that the coefficient of thermal expansion ("CTE") of such composite is variable as a function of the diamond/metal ratio but not as to the particle size. It has been generally recognized that particles of small size are required to obtain a CTE compatible with the known uses of such composites.

By way of example, the composites disclosed in the Supan, et al. U.S. Pat. No. 5,045,972 contain 5 to 80 volume percent diamond particles with a particle size from 1 to 50 microns. Similarly, the composites disclosed in the Burnham, et al. U.S. Pat. No. 5,008,737 contain a diamond/metal ratio disclosed only as being compatible in its CTE with the CTE of a semiconductor material with which used with a particle size of its largest dimension no greater than 106 microns, preferably less than 38 microns and more preferably less than 3 microns.

In contrast, thermal conductivity is directly variable with particle size and applicants have discovered that, in direct contrast to the teachings of the known prior art to use diamond particles of extremely small size, diamond/metal composites may be made with large diamond particles thus enhancing the thermal conductivity of the material without affecting the CTE of the composite.

It is accordingly an object of the present invention to obviate many of the problems of the prior art and to provide a novel diamond/metal composite and method, which composite has particular utility in circuit card assembly thermal cores, multichip module substrate carriers, containers for electronic components and tamper proof electronic packaging.

It is another object of the present invention to provide a novel diamond/metal composite matched in CTE with the material with which used with enhanced thermal conductivity.

These and many other objects and advantages of the present invention will be readily apparent to one skilled in the art to which the invention pertains from a perusal of the claims, the appended drawings, and the following detailed description of preferred embodiments.

DESCRIPTION OF PREFERRED EMBODIMENTS

A method of producing the composite of the present invention is described in the copending Montesano U.S. application entitled "Hermetic Packages For Single-Multiple Dies", Ser. No. 098,057 filed Jul. 28, 1993 and assigned to the assignee hereof. The disclosure of said application is hereby incorporated herein by reference.

As disclosed in said copending application, an electrically insulative plate may have apertures cut therethrough in a pattern which corresponds to the leads of an electrical component or an electronic module which is to be mounted on the plate. The apertures may then be filled with diamond particles less than about 20 microns. The insulative plate with its filled apertures may then be subjected to pressure infiltration of a liquid metal, typically by placing the apertured plate inside a mold and injecting an electrically conductive liquid metal into the mold under high pressure and at a high temperature. After cooling, the plate may be removed from the mold.

The metal and the diamond particles form a monolithic composite material which is electrically conductive and is bonded to the walls of the apertures by the metal. In this way an electrically conductive path may be formed by the composite through the insulative plate of electrical package.

In the composite of the present invention, the diamond particles are between about 110 microns and about 160 microns in size, preferably between about 140 and 160 microns. The particles comprise 10% to 80% by volume, preferable 40% to 60%, and the metal may be any one or more of the group consisting of silver, copper, nickel and beryllium.

Alternatively, the composite of the present invention may be used to form the package, with the conductive paths for the electronic circuit contained therein insulated from the package in any suitable conventional way such as by glass beads or the like. Where the heat transfer characteristics of the material are desired, the composite may be used as structural members of various types.

Figure 1:
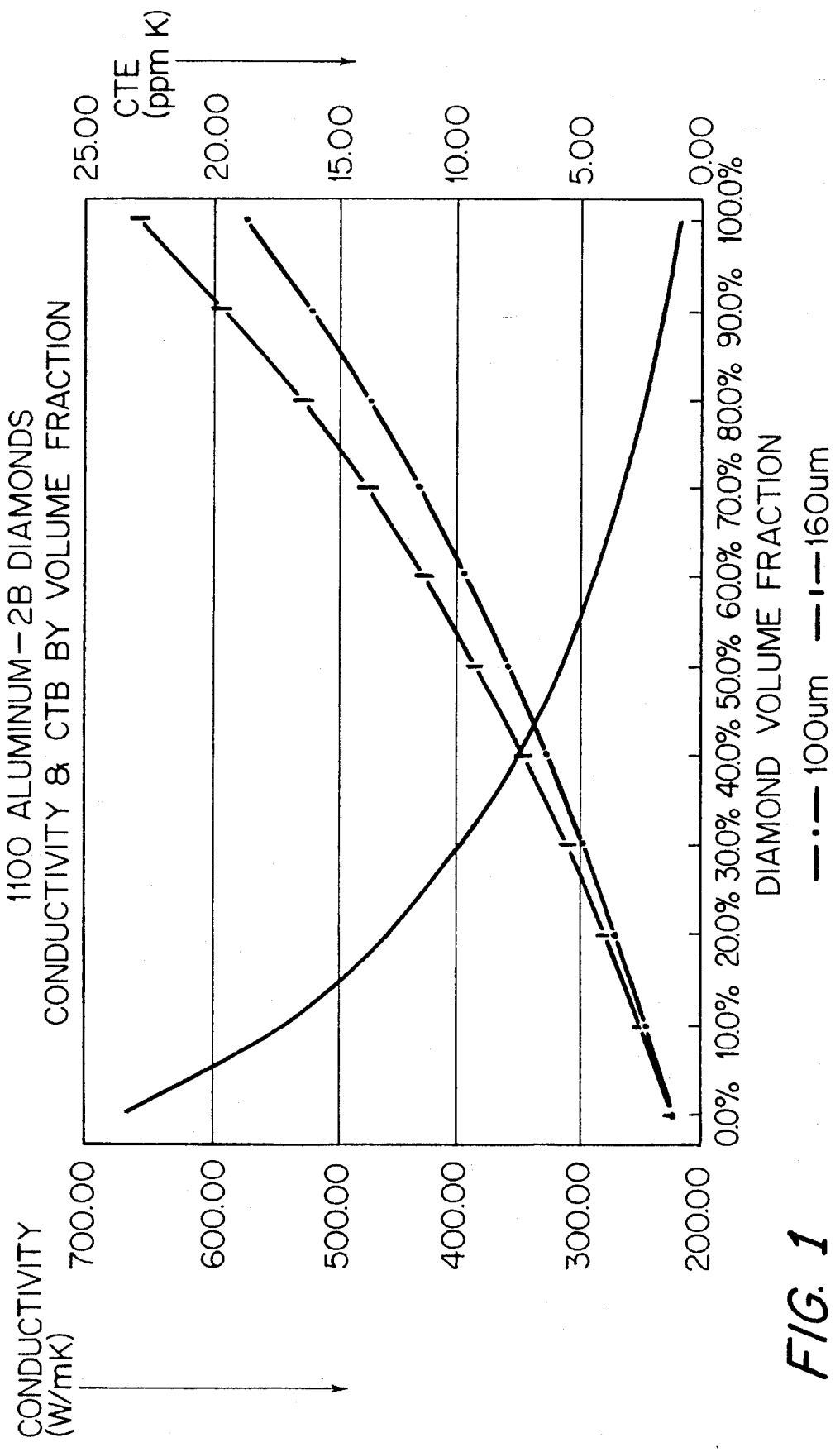
FIG. 1 is a plot of CTE and thermal conductivity as a function of the diamond/metal ratio for diamond particles of different sizes.

As shown in FIG. 1 where the curves at different particle size are plotted for a composite of 1100 aluminum and 2B diamonds, thermal conductivity and CTE vary inversely with respect to each other as the percentage of diamonds increases in the composite. Note that the curves for thermal conductivity vary with particle size, but that the CTE is independent of particle size. It is thus possible to take advantage of the increased thermal conductivity associated with large particles without changing the CTE of the composite.

Figure 2:
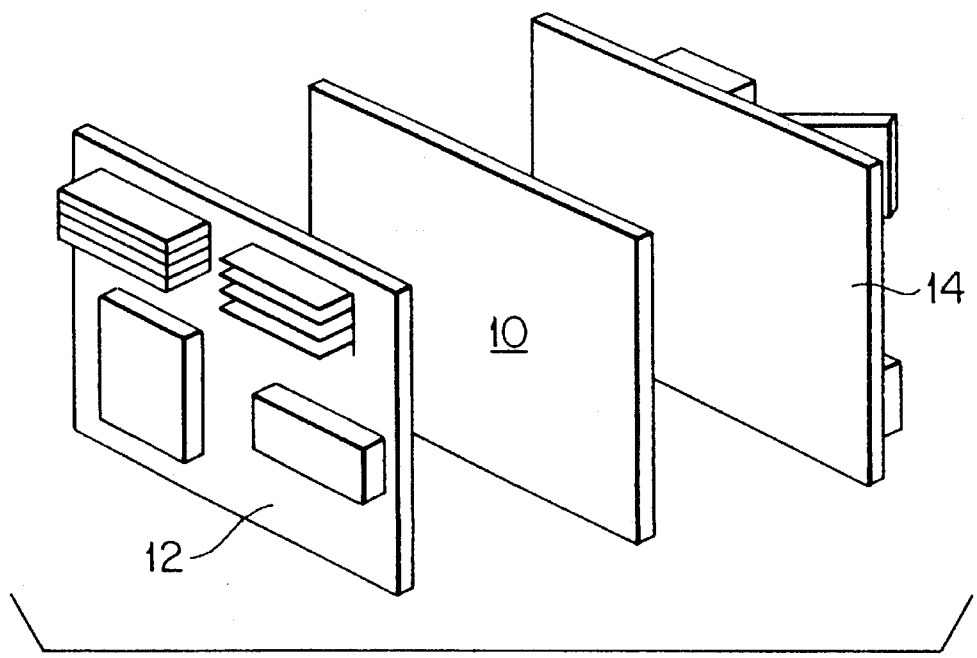
FIG. 2 is an exploded pictorial view of the composite of the present invention in an application as a high conductivity, isotropic thermal core for printed wiring boards.

For example, and with reference to FIG. 2, the composite of the present invention may be used as a thermal core 10 for printed wiring boards ("PWBs") 12 and 14 where the core 10 provides mechanical support for the surface mounted PWBs 12 and 14 as well as a conduction path for the thermal energy to be dissipated therefrom. The CTE may be matched with the CTE of the PWBs without sacrificing the low mass, high strength-to-weight, high stiffness, isotropic characteristics of the composite core. Effective heat transfer between the core and the PWB may be insured by the use of a very thin diamond/epoxy thermally conductive adhesive.

Figure 3:
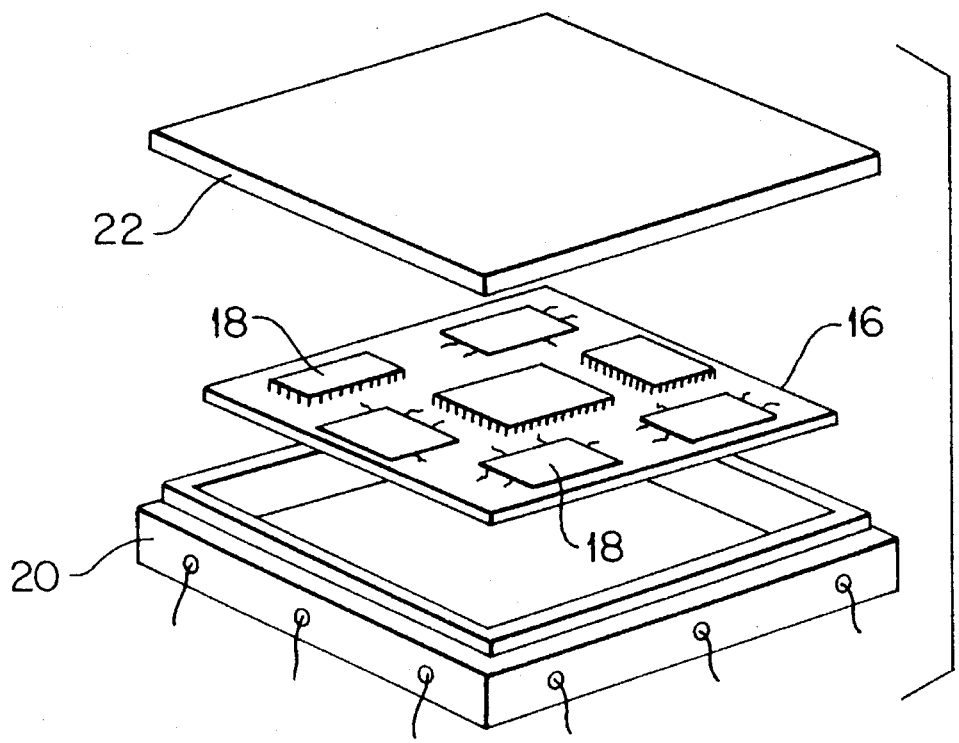
FIG. 3 is exploded pictorial view of the composite of the present invention in an application as a high conductivity, isotropic, tamper proof electronic package.

As shown in FIG. 3, the composite may also be used as a package 20 for various electronic components 18. Because accessibility to the electronics within the high strength package is restricted, such packages can be referred to as "tamper proof" packages. The components 18 may be mounted on a board 16 and the package 20 may have a concave base enclosed with a cover 22. The base may include electrically conductive paths to provide access to the components inside the package. As discussed above, the composite may form one or more of the base and cover, or may form the electrically conductive paths.

ADVANTAGES AND SCOPE OF THE INVENTION

The method and composite of the present invention has a significant advantage over known composites in the size of the diamond particles contained therein. Without a change in the diamond/metal ratio, the larger size diamond particles provide a composite of increased thermal conductivity without sacrificing CTE. Thus the CTE of the composite may be matched with the CTE of the electrical components with which associated and still retain the advantages of high conductivity. While exemplary embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A mounting plate for a semiconductor circuit comprising a composite of a metal having a plurality of diamond particles interspersed therein, said particles being greater than 110 microns and less than 160 microns in size, and said composite having a CTE which approximates the CTE of the semiconductor circuit.

2. The mounting plate of claim 1 wherein the size of said particles is greater than 140 microns and wherein the CTE of said composite is independent of particle size.

3. The mounting plate of claim 1 wherein said metal is one or more of the group consisting of silver, copper, nickel and beryllium; and wherein the volume ratio of said diamond particles to metal in said composite is between 10% and about 80%.

4. The mounting plate of claim 1 wherein said particles are between about 140 and 160 microns; and wherein the volume ratio of said diamond particles to metal in said composite is between 40% and about 60%.

5. The mounting plate of claim 1 wherein the CTE of said composite is independent of particle size and independent of thermal conductivity.

6. The mounting plate of claim 1 wherein the CTE of said composite is independent of the size of said particles.

7. The mounting plate of claim 1 wherein said particles are greater than 120 microns.

8. The mounting plate of claim 1 wherein said particles are greater than 130 microns.

* * * * *